United States Patent
Kim et al.

(10) Patent No.: US 7,295,196 B2
(45) Date of Patent: Nov. 13, 2007

(54) LIQUID CRYSTAL DISPLAY PANEL WITH SIGNAL TRANSMISSION PATTERNS

(75) Inventors: Sang-Soo Kim, Seoul (KR); Choong-Seob Oh, Suwon (KR); Jin-Hyeok Park, Seongnam (KR); Jin-Ho Park, Seongnam (KR); Dong-Gyu Kim, Suwon (KR); Yong-Eun Park, Seongnam (KR); Nam-Soo Kang, Seoul (KR); Gyu-Su Lee, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/109,680

(22) Filed: Apr. 20, 2005

(65) Prior Publication Data

US 2005/0190174 A1  Sep. 1, 2005

Related U.S. Application Data

(63) Continuation of application No. 10/693,459, filed on Oct. 27, 2003, which is a continuation of application No. 09/551,404, filed on Apr. 17, 2000, now Pat. No. 6,639,589.

(30) Foreign Application Priority Data

Apr. 16, 1999 (KR) .................................. 99-13650

(51) Int. Cl.
*G09G 3/36* (2006.01)

(52) U.S. Cl. .................. 345/206; 345/87; 345/903; 345/905; 349/139; 349/149; 349/151; 349/152

(58) Field of Classification Search ............... 345/87, 345/206, 903, 905; 349/139, 143, 149, 150, 349/151, 152
See application file for complete search history.

(56) References Cited

U.S. PATENT DOCUMENTS 5,028,916 A * 7/1991 Ichikawa et al. ............. 345/90

(Continued)

FOREIGN PATENT DOCUMENTS

JP 405326622 A 12/1993

(Continued)

OTHER PUBLICATIONS

Tetsuya Yamamoto; Mounting method, mounting device, anisotropoic conductive material and Tape Carrier Package; Pub Date Nov. 4, 1998; Pub. No. JP410294341A; Document Identifier JP 10294341.*

*Primary Examiner*—Bipin Shalwala
*Assistant Examiner*—Vincent E. Kovaick
(74) *Attorney, Agent, or Firm*—Don C. Lawrence; MacPherson Kwok Chen & Heid LLP

(57) ABSTRACT

A liquid crystal display of compact size is disclosed. The liquid crystal display has a tape carrier package and a single integrated PCB for processing a gate driving signal and data driving signal. The tape carrier package includes a base substrate, a gate driver IC formed on said base substrate, an input pattern formed on said base substrate that applies gate driving signals input from an external device to the gate driver IC, a first output pattern formed on said base substrate that outputs a first gate driving signal processed in said gate driver IC, and a second output pattern formed on said base substrate, that outputs a second gate driving signal bypassing the gate driver IC among the gate driving signals.

19 Claims, 7 Drawing Sheets

U.S. PATENT DOCUMENTS

| | | | |
|---|---|---|---|
| 5,029,984 A * | 7/1991 | Adachi et al. | 349/150 |
| 5,362,996 A * | 11/1994 | Yizraeli | 326/27 |
| 5,376,913 A * | 12/1994 | Pine et al. | 338/114 |
| 5,406,398 A * | 4/1995 | Suzuki et al. | 349/154 |
| 5,565,885 A | 10/1996 | Tamanoi | 345/100 |
| 5,592,199 A | 1/1997 | Kawaguchi et al. | 345/206 |
| 5,654,874 A | 8/1997 | Suzuki | 361/685 |
| 5,670,994 A | 9/1997 | Kawaguchi et al. | 345/206 |
| 5,701,167 A | 12/1997 | Yamazaki | 349/42 |
| 5,712,493 A | 1/1998 | Mori et al. | 257/59 |
| 5,737,272 A * | 4/1998 | Uchiyama et al. | 345/206 |
| 5,754,171 A | 5/1998 | Stoller | 345/205 |
| 5,760,854 A * | 6/1998 | Ono et al. | 349/38 |
| 5,768,109 A | 6/1998 | Gulick et al. | 361/794 |
| 5,822,027 A * | 10/1998 | Shimada et al. | 349/39 |
| 5,828,433 A * | 10/1998 | Shin | 349/147 |
| 5,838,400 A * | 11/1998 | Ueda et al. | 349/58 |
| 5,838,412 A | 11/1998 | Ueda et al. | 349/150 |
| 5,841,414 A | 11/1998 | Tanaka | 345/87 |
| 5,910,830 A * | 6/1999 | Nam | 349/158 |
| 5,968,850 A * | 10/1999 | Jeong et al. | 438/754 |
| 5,976,953 A * | 11/1999 | Zavracky et al. | 438/455 |
| 5,986,342 A | 11/1999 | Uchiyama et al. | 257/758 |
| 5,986,726 A | 11/1999 | Murai | 349/59 |
| 5,986,739 A * | 11/1999 | Kobayashi | 349/143 |
| 6,061,246 A | 5/2000 | Oh et al. | 174/254 |
| 6,094,065 A | 7/2000 | Tavana et al. | 326/39 |
| 6,128,063 A | 10/2000 | Uchiyama et al. | 349/150 |
| 6,147,724 A | 11/2000 | Yoshii et al. | 349/58 |
| 6,157,357 A | 12/2000 | Kim | 345/87 |
| 6,295,110 B1 * | 9/2001 | Ohe et al. | 349/124 |
| 6,297,869 B1 | 10/2001 | Choo et al. | 349/187 |
| 6,313,526 B1 | 11/2001 | Nakamura | 206/714 |
| 6,326,561 B1 | 12/2001 | Watanabe et al. | 174/264 |
| 6,335,773 B1 * | 1/2002 | Kamei et al. | 349/96 |
| 6,366,264 B1 | 4/2002 | Kurumada | 345/60 |
| 6,380,918 B1 | 4/2002 | Chiba et al. | 345/90 |
| 6,407,447 B1 | 6/2002 | Takatsu | 257/678 |
| 6,456,344 B1 | 9/2002 | Nemoto et al. | 349/64 |
| 6,531,996 B1 | 3/2003 | Murade | 345/98 |
| 6,567,145 B1 | 5/2003 | Kaneko et al. | 349/139 |
| 6,619,785 B1 | 9/2003 | Sato | 347/50 |
| 6,639,589 B1 | 10/2003 | Kim et al. | 345/206 |
| 6,664,616 B2 | 12/2003 | Tsubosaki et al. | 257/668 |
| 2001/0020988 A1 | 9/2001 | Ohgiichi et al. | 349/54 |
| 2001/0022568 A1 | 9/2001 | Kang | 345/87 |

FOREIGN PATENT DOCUMENTS

| | | |
|---|---|---|
| JP | 6258651 | 9/1994 |

* cited by examiner

LIQUID CRYSTAL DISPLAY PANEL WITH SIGNAL TRANSMISSION PATTERNS

CROSS REFERENCE

This application is a continuation application of Applicant's U.S. patent application Ser. No. 10/693,459, filed on Oct. 27, 2003, which is a continuation application of U.S. patent application Ser. No. 09/551,404 filed on Apr. 17, 2000, which issued as U.S. Pat. No. 6,639,589 on Oct. 28, 2003, which claims priority to and the benefit of Korean Patent Application No. 1999-13650, filed on Apr. 16, 1999, which are all hereby incorporated by reference for all purposes as if fully set forth herein.

BACKGROUND OF THE INVENTION

1. Field of the Invention

The present invention relates to a tape carrier package for a compact size liquid crystal display (LCD), and more particularly to a tape carrier package (TCP) capable of receiving both of gate signal and data signal which are processed in a single integrated printed circuit board and transmitting the processed signals to an LCD panel and another TCP. Further, the invention relates to a liquid crystal display panel to which the tape carrier package is applied.

2. Description of the Related Art

Generally, an LCD is a mostly used type of flat panel display. Especially, the small size, lighter weight and lower power consumption render the LCD to replace the traditional cathode ray tube (CRT). The LCD is currently used as a monitor for a lap-top computer and even for a desktop computer, gaining its popularity.

As shown in FIG. 1, an LCD includes an LCD panel 101 and a light supply unit. The LCD panel 101 includes a TFT substrate 10, a color filter substrate 20, multiple gate TCPs 30 connected to gate lines (not shown) of the TFT substrate 10, multiple data TCPs 40 connected to data lines (not shown) of the TFT substrate 10, a gate PCB 50 connected to the multiple gate TCPs 30, a data PCB 60 connected with the multiple data TCPs 40. The light supply unit includes multiple optical sheets such as a light guiding plate 90, a light diffusing plate (not shown), etc., a lamp assembly 80, and a receiving case called as "mold frame". The light guiding plate 90 has a decreasing thickness as it travels from the lamp unit 80 to the data PCB 60.

A power supply unit and a controller that processes gate signals and data signals coming from an external device are mounted on the data PCB 60. A gate voltage supply part is formed on the gate PCB 50 and supplies a gate driving voltage to gate lines by a control signal from the controller on the data PCB 60.

To supply the control signal and the gate driving voltage into the gate PCB 50 from the data PCB 60, connectors 55 and 65 are respectively installed in the gate PCB 50 and data PCB 60 and are connected to each other through a connecting member, "flexible printed circuit (FPC)".

Semiconductor fabrication technologies have developed in the areas of thin film formation, and packaging. This allows semiconductor devices to be mounted on the gate PCB 50 and to function as gate power supply source on the data PCB 60.

Under such a configuration, the gate PCB 50 only transfers to the gate TCP 30 gate driving signals processed in the data PCB 60.

The conventional LCD has following problems.

First, in order to apply gate driving signals processed in data PCB 60 to gate PCB 50, gate PCB 50 and data PCB 60 need connectors 55 and 65.

The connectors 55 and 56 are generally installed on the front surface or on the rear surface of the PCBs 50 and 60. This increases the thickness of the LCD and makes it difficult to achieve a compact size LCD.

And the flexible printed circuit (FPC) 70 that connects the connector 55 and the connector 65 complicates the assembly process and increases the fabrication costs.

Finally, a bent type PCB that is mostly used currently bends a gate PCB 50 and data PCB 60 and they are fixed at the rear surface of the reflecting plate of a backlight assembly. In such a configuration, the data PCB 60 is put in a space between a relatively thin side edge 92 of the non-symmetric light guiding plate 90 and the mold frame. Thus the data PCB 69 does not increase the thickness of the LCD much. On the other hand, the gate PCB 50 is put in a space between a thickness varying side of the light guiding plate 90, and the mold frame. Specifically, one side of the gate PCB 50 is attached to a thick portion of the rear surface of the light guiding plate 90, making a thick LCD depending on the thickness of the light guiding plate 90.

SUMMARY OF THE INVENTION

The present invention is to provide an integrated PCB that has a gate PCB and a data PCB on one board and is capable of allowing driving signals to be applied to gate lines and data lines without using additional connectors and flexible printed circuits.

It is another object of the present invention to allow a tape carrier package that receives a driving signal from the integrated PCB to transmit the received driving signal into another tape carrier package.

It is yet another object of the present invention to prevent delays of driving signals when a driving signal processed in the integrated PCB is sent to gate lines or data lines via tape carrier packages.

It is still another object of the present invention to provide an improved assembly between tape carrier packages and TFT substrate, thereby attaining an easy carrying and decreasing the thickness of the panel.

To achieve these and other advantages in accordance with the purpose of the present invention as embodied and broadly described, a tape carrier package comprises a base substrate, a gate driver IC formed on the base substrate, an input pattern formed on the base substrate that supplies gate driving signals input from an external device to the gate driver IC, a first output pattern formed on said base substrate that outputs a first gate driving signal processed in the gate driver IC, and a second output pattern formed on said base substrate, that outputs a second gate driving signal bypassing the gate driver IC among the gate driving signals.

Also a liquid crystal display panel assembly and a liquid crystal display using such an assembly are disclosed.

BRIEF DESCRIPTION OF THE DRAWINGS

The above objects and other advantages of the present invention will become more apparent by describing in detail a preferred embodiment with reference to the attached drawings in which.

DETAILED DESCRIPTION OF THE PREFERRED EMBODIMENTS

Reference will now be made in detail to the preferred embodiments of the present invention, examples of which are illustrated in the accompanying drawings.

Hereinafter, a liquid crystal display panel, a tape carrier package and a liquid crystal display according to the present invention are described more fully with reference to the accompanying drawings.

Figure 1:
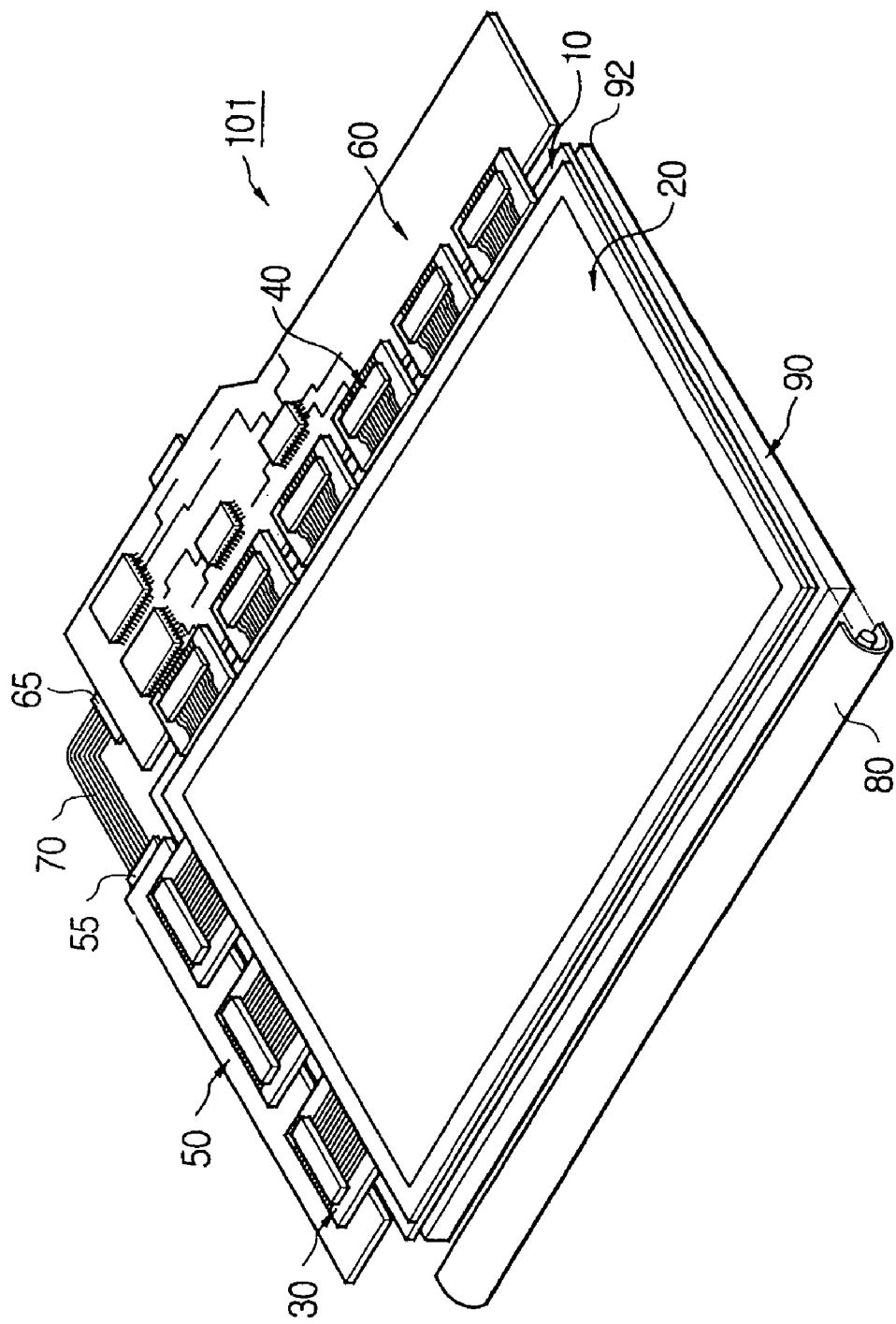
FIG. 1 is a perspective view showing a conventional liquid crystal display panel.
Figure 2:
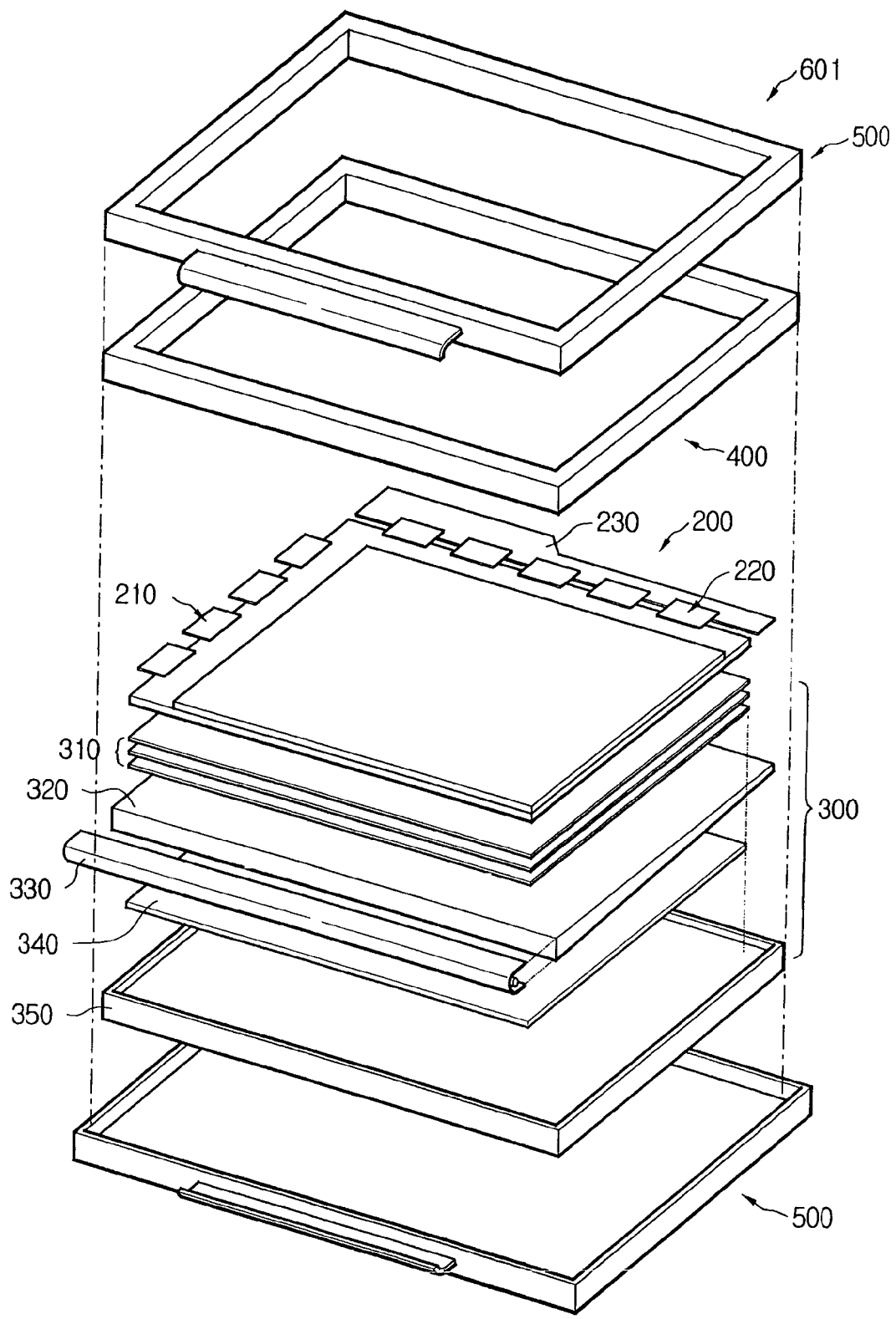
FIG. 2 is an exploded perspective view of the liquid crystal display according to a preferred embodiment of the present invention.

FIG. 2 is an exploded perspective view of the liquid crystal display according to a preferred embodiment of the present invention.

The liquid crystal display 601 comprises a liquid crystal display panel assembly 200, a back light assembly 300, a chassis 400 and a cover 500.

The back light assembly 300 is comprised of optical sheets 310, a light guiding plate 320, a lamp assembly 330, a light reflecting plate 340 and a mold frame as a receiving container.

Hereinafter, the liquid crystal display panel assembly 200 according to the present invention is described referring to the FIG. 3 and the liquid crystal display panel is then described more fully referring to FIG. 4.

Figure 3:
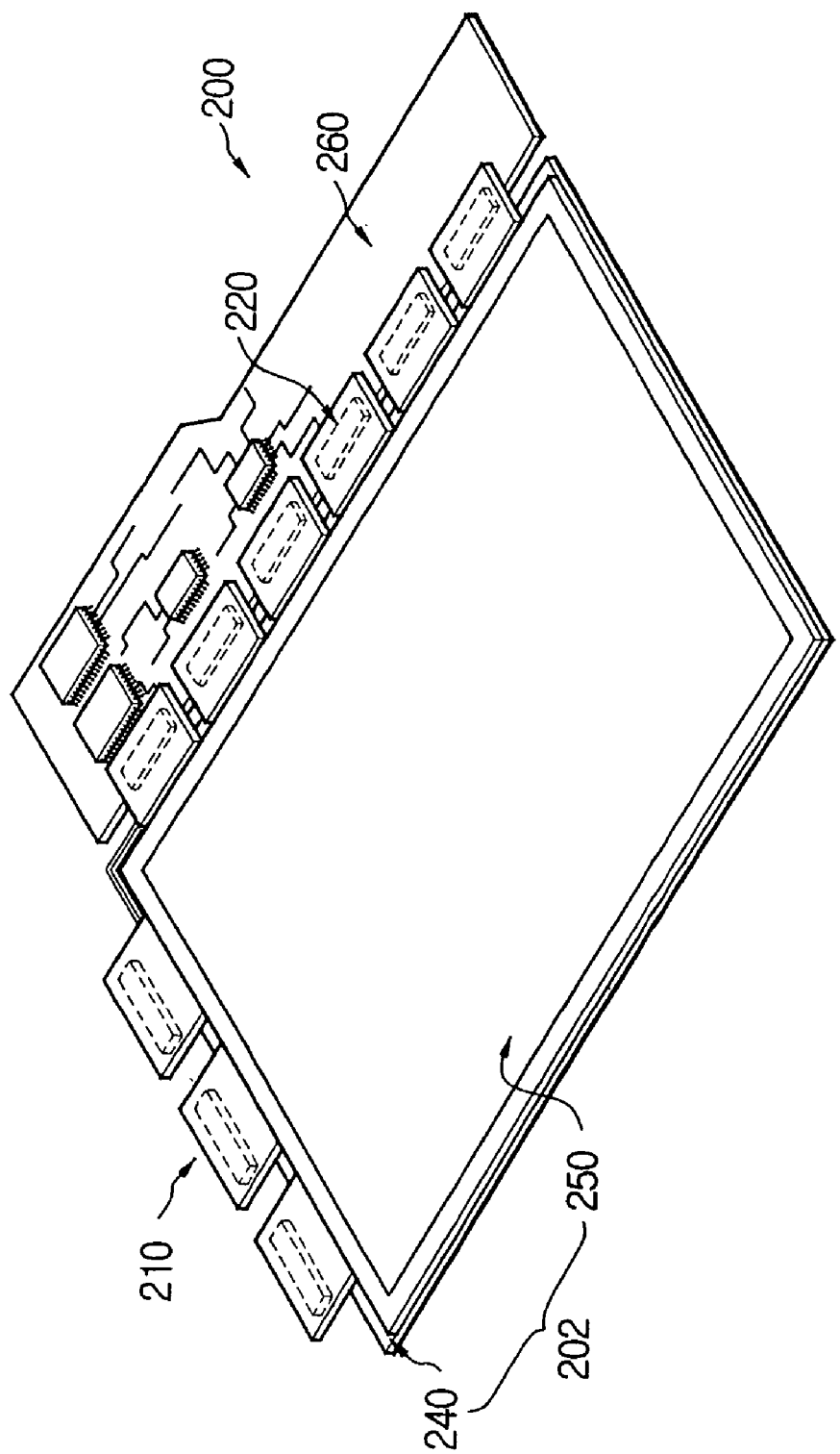
FIG. 3 is a perspective view of the liquid crystal panel according to a preferred embodiment of the present invention.

Referring to FIG. 3, the liquid crystal display panel assembly 200 comprises a liquid crystal display panel 202 having a TFT substrate 240 and a color filter substrate 250, a liquid crystal (not shown) interposed between the TFT substrate 240 and the color filter substrate 250, tape carrier packages 210 and 220 and a single integrated PCB 260.

Figure 4:
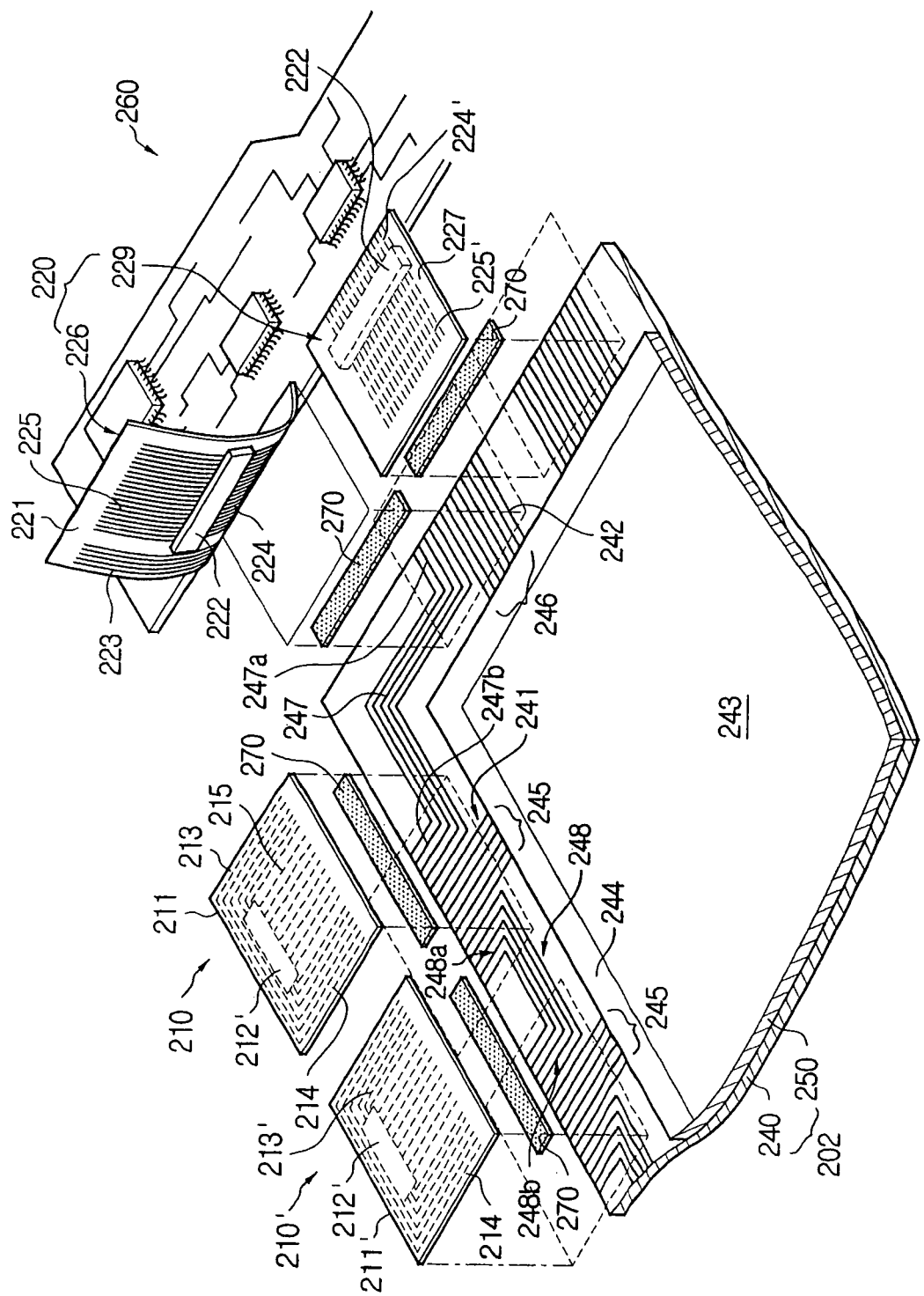
FIG. 4 is a partially exploded perspective view of the liquid crystal display panel according to a preferred embodiment of the present invention.

Referring to FIG. 4, the liquid crystal display panel 202 comprises a TFT substrate 240 and a color filter substrate 250. The filter substrate 250 is smaller than the TFT substrate 240 and faces the TFT substrate 240. The TFT substrate 240 includes a gate 261, a data line 242, a thin film transistor (not shown) and a pixel electrode (not shown).

The tape carrier packages 210, 210', 226, and 229 are electrically coupled to the TFT substrate 240 and includes gate tape carrier packages 210 and 210' and data tape carrier packages 226 and 229. The gate tape carrier packages 210 and 210' are connected to the gate lines on the TFT substrate 240. The data tape carrier packages 226 and 229 are connected to the data lines.

The single integrated PCB 260 that is electrically connected to the tape carrier packages 226 and 229 has various driving elements for processing gate driving signals and data driving signals. The gate driving signals are input to the gate tape carrier package 210 and the data driving signals are input to the data tape carrier package 220.

The color filter substrate 250 includes a transparent glass substrate 250. The transparent glass substrate 250 has a lattice type black matrix (not shown), an RGB pixel (not shown) and a transparent and conductive ITO (Indium Thin Oxide) electrode. Here, the RGB pixels are formed by patterning a photoresist mixed with RBG pigment. The ITO electrode functions as a common electrode.

Meanwhile, the TFT substrate 240 includes a transparent glass substrate. On the transparent glass substrate, a plurality of thin film transistors (not shown) each including a gate, a source, and a drain are formed in a matrix arrangement by the semiconductor thin film formation process.

Gate terminals of all the thin film transistors in a row are connected to a gate line 241 that is extended to an end of the one side of the TFT substrate 240. Source terminals of all the thin film transistors in one column are connected to a data line 242 formed at an end of the other side of the TFT substrate 240. The drain terminal of each thin film transistor is connected to an ITO electrode, which is a pixel electrode. Therefore, the ITO electrode faces the common electrode of the color filter substrate 250.

Further, the gate lines 241 are disposed in an effective display region 243 at the same interval with respect to each other while they are disposed in a perimeter region with a smaller interval than the interval of the gate line of the effective display region 243, i.e., the gate lines 241 in the perimeter region are concentrated towards output terminals of the TCPs 210 and 210'.

The preferred embodiment of the present invention has three gate line groups, although FIG. 4 shows only two gate line groups 245.

Also, the data lines 242 are disposed in the effective display region 243 at the same interval with respect to each other. The data lines 242 are collected toward output terminals of the TCPs 226 and 229 on the perimeter region 244 and form a data line group 246 on the perimeter region 244 and connected to the data tape carrier packages 226 and 229.

Figure 6:
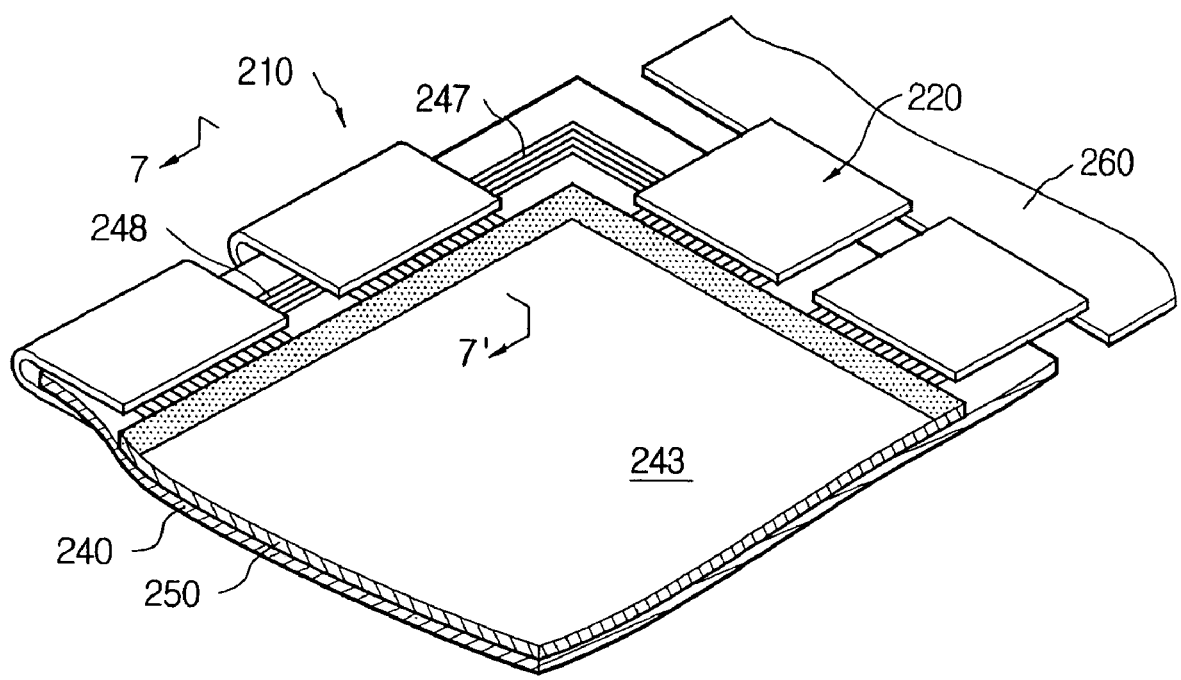
FIG. 6 is a perspective view showing an assembly of tape carrier package and TFT substrate of the liquid crystal display panel according to a preferred embodiment of the present invention.

The preferred embodiment of the present invention has six data line groups and FIG. 6 shows only two data line groups 246.

Some lines of a gate line group 245 placed at one edge and some lines of a data line group 246 placed at one edge around a corner of the TFT substrate 240 are connected to each other, thereby forming a first gate driving signal transmission line 247.

One end of the first gate driving signal transmission line 247 extends to one side of the TFT substrate 240 in which the end of the outermost gate line group 245 is formed. The other end of the first gate driving signal transmission line 247 extends to one side of the TFT substrate 240 in which the end of the outermost data line group 246 adjacent to the gate line group 245 is disposed.

In the first gate driving signal transmission line 247, an input terminal 247a that receives a signal is defined as one end portion of the first gate driving signal transmission line 247 at the side of the TCP 226. And an output terminal 247b is defined as the other end of the first gate driving signal transmission line 247 at the side of the TCP 221.

Meanwhile, a second gate driving signal transmission line 248 is formed at the space between the two gate line groups 245.

One end of the second gate driving signal transmission line 248 is formed at one side of the TFT substrate 240 and extends to a desired length in parallel with the gate line group 245. The second gate driving signal transmission line 248 is bent perpendicularly to the adjacent gate line group 245 and extends again to a desired length. And the second gate driving signal transmission line 248 is then bent to be parallel with the adjacent gate line group 245 and extends to the other side of the TFT substrate 240.

At this time, an input terminal 248a is defined as one end portion of the second gate driving signal transmission line 248 and an output terminal 248b is defined as the other end portion of the second gate driving signal transmission line 248.

The gate tape carrier packages 210 and 210' and data tape carrier packages 226 and 229 will be described more fully referring to the FIG. 4.

The gate tape carrier package 210 is comprised of a FPC 211, a gate driver IC 212, a gate driving signal input pattern 213, a first gate driving signal output pattern (or a bypass line) 214, a second gate driving signal output pattern 215.

The gate driver IC 212 is disposed at the rear surface of the FPC 211 in a flip chip type manner. The second gate driving signal output pattern 215 is disposed at the FPC 211 on which the gate driver IC 212 is disposed. One end of the second gate driving signal output pattern 215 is connected with output terminals of the gate driver IC 212 and the other end of the second gate driving signal output pattern 215 is connected through an anisotropic conductive film 270 to the gate line group 245.

The gate driving signal input pattern 213 receives the gate driving signal from the output terminal 247b of the first gate driving signal transmission line 247 and sends the signal to the gate driver IC 212.

Thus, one end of the gate driving signal input pattern 213 is connected through the anisotropic conductive film 270 to the output terminal 247b of the first gate driving signal transmission line 247 and the other end of the gate driving signal input pattern 213 is connected to the input terminals of the gate driver IC 212.

The first gate driving signal output pattern 214 relays the gate driving signal from the TCP 226 to the input terminal 248a of the second gate driving signal transmission line 248 formed between the gate line groups 245.

To realize this, one end of the first gate driving signal output pattern 214 is connected through the anisotropic conductive film 270 to the input terminal 248a of the second gate driving signal transmission line 248 and the other end the first gate driving signal output pattern 214 is connected to the output terminal 247b of the first gate driving signal transmission line 247.

At this time, the first gate driving signal output pattern 214 and the gate driving signal input pattern 213 are formed to be symmetric with respect to the gate driver IC 212.

If an output enable signal (OE signal) is ON, the gate driving signal, which is input through the gate driving signal input pattern 213 to the gate driver IC 212, is processed in the corresponding gate driver IC 212, and then applied to the second gate driving signal output pattern 215. If the OE signal is OFF, the gate driving signal is not applied to the second gate driving signal output pattern 215 but to the first gate driving signal output pattern 214.

Meanwhile, the data tape carrier package includes a plurality of packages, i.e., a dual functioning tape carrier package 226 for processing the gate driving signals and the data driving signals and a single functioning tape carrier package 229 only for the data driving signal.

Referring to FIG. 4, the dual functioning tape carrier package 226 for gate/data driving signals comprises a FPC 221 that is a flexible base film 221, the gate driving signal transmission pattern 223, a data driver IC 222, a data driving signal input pattern 224 and a data driving signal output pattern 225.

Further, the data driver IC 222 is disposed at the rear surface of the FPC 221 in a flip chip type manner. One end of the data driving signal input pattern 224 is connected to input terminals of the data driver IC 222. And the other end of the data driving signal input pattern 224 is connected to the single integrated PCB 260.

In addition, one end of the data driving signal output pattern 225 is connected to output terminals of the data driver IC 222, and the other end of the data driving signal output pattern 225 is connected through a anisotropic conductive film 270 to the aforementioned data line group 246.

On the FPC 221 of the dual functioning tape carrier package 226 for the gate/data driving signals, there are formed the data driving signal output pattern 225, the data driving signal input pattern 224, the data driver IC 222 and the gate driving signal transmission pattern 223 that is separate from the data driver IC 222.

One end of the gate driving signal transmission pattern 223 is connected to the single integrated PCB 260. And the other end of the gate driving signal transmission pattern 223 is connected through the anisotropic conductive film 270 to the input terminal 247a of the first gate driving signal transmission line 247.

Meanwhile, the single functioning tape carrier package 229 comprises a FPC 227, a data driver IC 222, a data driving signal input pattern 224' and a data driving signal output pattern 225'.

One end of the data driving signal input pattern 224' is connected to the single integrated PCB 260. And the other end of the data driving signal input pattern 224' is connected to input terminals of the data driver IC 222. One end of the data driving signal output pattern 225' is connected to output terminals of data driver IC 222. And the other end of the data driving signal output pattern 225' is connected through the anisotropic conductive film 270 to the data line group 246.

Therefore, the gate driving signal generated from the single integrated PCB 260 is input through the gate driving signal transmission pattern 223 of the dual functioning tape carrier package 226 for the gate/data driving signal, the input terminal 247a of the first gate driving signal transmission line 247, the output terminal 247b of the first gate driving transmission line 247 and the gate driving signal input pattern 213 of the gate tape carrier package 210 to the gate driver IC 212. The gate driving signal is then input through the second gate driving signal output pattern 215 to the gate line group 245 by the OE signal. Meanwhile, some of the gate driving signal generated from the single integrated PCB 260 are input through the first gate driving signal output pattern 214 to the gate driving signal input patter 213' or the first gate driving signal output pattern 214' of the adjacent TCP 211'.

The signals that come from the single integrated PCB 260 through the above passages to the gate line group 245 are a gate clock, the OE signal, a $V_{ON}$ signal which is a turn-on signal of the thin film transistor and a $V_{OFF}$ signal which is a turn-off signal of the thin film transistor.

In addition, the data driving signal generated from the single integrated PCB 260 is input through the tape carrier package 221 for the gate/data driving signal and the single functioning tape carrier package 229 only for the data driving signal to the data line group 246 of the TFT substrate 240.

The signals input from the single integrated PCB 260 through the data driving signal input patterns 224 and 224', the data driver IC 222 and the data driving signal output patterns 225 and 225' to the data line group 246, are a STH (Start Horizontal) signal for exactly latching a color data from an outer data processing unit to the data driver IC 222, a LOAD signal which outputs the signal latched in the data driver IC 222 to the liquid crystal display panel assembly 200, a clock signal for transmitting the data and RGB color data, etc.

Next, operations of the liquid crystal display according to the present invention are described with reference to the accompanying drawings.

Video signals as well as electric power, control signals, and color data are input from an external information processing unit to the single integrated PCB 260. The single integrated PCB 260 then generates gate driving signals and data driving signals depending on the input video signals. Thereafter, the data driving signals generated from the single integrated PCB 260 are respectively input into the respective data driver IC 222 and 222' via the data driving signal input patterns 224 and 224' of data driving signal transmission lines of the dual functioning tape carrier package 226 and the single functioning tape carrier package 229. The processed data driving signals are loaded to selected data lines 242 of the data line group 246 via the data driving signal output patterns 225 and 225'. At this time, gray scale voltages for displaying colors are also applied to respective data lines 242.

Simultaneously, among gate driving signals processed in the single integrated PCB 260, a gate voltage is sent to an input terminal 247a of the first gate driving signal transmission line 247 through the gate driving signal transmission pattern. One component of the gate driving signals is a gate voltage. The gate voltage goes along the first gate driving signal transmission line 247 and then is sent to the input terminal of the gate driving signal input pattern 213.

The driving signals inputted to the gate driving signal input pattern 213 are also transferred into the gate driving signal input pattern 213' of the adjacent gate tape carrier package 210' through the first gate driving signal output pattern 214 connected to the input terminal of the gate driving signal input pattern 213 and the input terminal 248a of the second gate driving signal transmission line 248 printed on the TFT substrate 240. By such signal transmissions, all the gate driver IC 212 and 212' are prepared to apply the gate driving signals to the gate lines by the OE signal.

Next, the OE signal is carried in or carried out into the gate driver ICs 212 and 212' via the gate driving signal pattern 223 of the TCP 226, the first gate driving signal transmission line 247, the gate driving signal input pattern 213, and the second gate driving signal transmission line 248 in the named order and thereby pre-designated gate voltages, such as turn-on voltage Von and turn-off voltage Voff are applied to all of the gate lines within a period of one frame.

As the Von signal is input into gate terminals of thin film transistors placed along the rows through the gate lines 241, the thin film transistors are all turned on and the gray scale voltages which has been already applied to the data lines 242 are applied to the pixel electrodes. This generates an electric field proportional to the gray scale voltage, between the pixel electrode and the common electrode.

As the voltages are applied to the pixel electrodes, the liquid crystal interposed between the pixel electrode and the common electrode re-arranges and the light transmittance changes accordingly. As a result, lights may pass through the TFT substrate 240 depending on the light transmittance. Thereafter, the lights pass through the RGB elements formed on the color filter substrate 250 and displays an image. At this time, the electric field between the pixel electrode and the common electrode is maintained for a period of one frame in which all the gate lines 241 are turned on in order.

The above-described operations are performed very quickly and, thus, the liquid crystal display appears to display information in full color.

The gate driving signals processed in the single integrated PCB 260 are input into all the gate lines 241 via the double functioning tape carrier package 226, the gate tape carrier package 210, and the gate driver IC 212.

Then, the transmission pattern and the transmission lines applied to the TFT substrate 240, the gate tape carrier package 210, the dual functioning tape carrier package 226 are formed in a very small space with a fine pitch. This fine pitch pattern and line may form a RC time delay circuit due to a very high resistance of the substrate and the parasitic capacitance formed between the gate transmission lines.

The RC time delay circuit may also cause the turn-on voltage Von and the turn-off voltage Voff of the gate driving signals to be modulated. A delay in transmission of the gate driving signals degrade the picture quality, causing flickers in the effective display region of the panel and a divisional appearance on the effective region of the panel.

Moreover, the modulation in the turn-on voltage and the turn-off voltage affects the gray scale voltage being input into the data lines 242, resulting in a variation in the gray scale. In other words, both of the gate driving signal delay and the modulation in the turn-on and turn-off voltages significantly degrades the picture quality and display colors.

In order to prevent the gate driving signal transmission delay and the modulation of the turn-on voltage and the turn-off voltage, the resistance between the transmission pattern and the transmission lines needs to be decreased. The resistance can be theoretically decreased by enlarging the sectional area of the gate driving signal transmission line and the gate driving signal pattern or sufficiently widening the interval between the gate driving signal transmission lines.

However, such a conventional wisdom consumes the scarce resource of real estate on the TFT substrate 240, making it more difficult to produce a compact and lighter LCD product.

Accordingly, several preferred embodiments are disclosed to resolve such drawbacks. They are described with reference to the accompanying drawing of FIG. 5.

As described referring to FIGS. 2 to 6, the first gate driving signal transmission line 247, the gate driving signal transmission pattern 223, the gate driving signal input pattern 213, the first gate output pattern 214 are grouped in plurality. For example, three gate driving signal line groups comprise a first gate driving signal line group 281, a second gate driving signal line group 282, and a third gate driving signal line group 283. Each of the three groups has a plurality of signal transmission lines.

A plurality of gate driving signals are transferred through the respective corresponding gate driving signal line groups 281, 282, and 283 into the respective corresponding gate driver ICs 212. Here, it is natural for the single integrated PCB 260 to have additional output terminals A, B, and C which are connected to the respective gate driving signal transmission groups.

Specifically, the first gate driving signal lines group 283 is connected to the first gate driver IC of the first gate tape carrier package, the second gate driving signal line group 282 is connected to the second gate driver IC of the second gate tape carrier package, and the third gate driving signal line group 281 is connected to the third gate driver IC of the third gate tape carrier package.

In other words, the plurality of gate driving signal transmission lines are grouped into several groups and respective groups are connected to corresponding gate driver ICs in parallel, thereby minimizing the RC time delay during the transmission of the gate driving signals and preventing the flicker and picture division appearance.

As another embodiment, upon considering the length of the respective gate driving signal lines from the single integrated PCB 260, the first gate driving signal line group 281 is longer than the second gate driving signal line group 282. And the second gate driving signal line group 282 is longer than the third gate driving signal line group 283. In the above constitution, since resistance of the lines groups is proportional to the length, the first gate driving signal lines group 281 has the biggest resistance when the diameter of the lines of the respective groups are the same. Therefore, in order to prevent RC time delay due to a difference in the resistance between the three gate driving signal lines, the diameter of each of signal transmission lines of the first gate driving signal line group is bigger than the second gate driving line group and the diameter of each of signal transmission lines of the second gate driving signal line group is bigger than the third gate driving line group.

Another embodiment to prevent the flicker and the picture division appearance phenomena applies respective gate driving signals corresponding to the respective gate driving signal line groups 281, 282, and 283 to the corresponding gate driving signal line groups 281, 282, and 283 with a time interval. A first gate driving signal corresponding to the first gate driving signal line group 281 is first applied to the first gate driving signal line group 281. A second gate driving signal corresponding to the second gate driving signal line group 282 is secondly applied to the second gate driving signal line group 282 after a first predetermined time elapses after sending the first gate driving signal. Then, a third gate driving signal corresponding to the third gate driving signal line group 283 is finally applied to the third gate driving signal line group 283 after a second predetermined time elapses after sending the second gate driving signal. The first and second predetermined time is determined by respective resistance values calculated considering the lengths and diameters of the first, second, and third gate driving signal line groups 281, 282, and 283.

As still another embodiment to prevent the flicker and the picture division appearance problems, respective gate driving signal line groups 281, 282 and 283 are electrically connected to respective corresponding gate driver ICs in parallel and a turning resistor that controls the timing of the gate driving signals is connected to the respective gate driving signal line groups 281, 282, and 283 or the single integrated PCB 260.

Specifically, Voff signal that turns off the thin film transistor proves to be sensitively affected by the substrate resistance and the signal transmission patterns. As described previously, since the substrate resistance and the pattern resistance are determined by the total length and the diameter of the gate driving signal line groups 281, 282, and 283, the gate driving signal line groups have different signal arriving time, generating the flicker and the picture division appearance problems and degrading the picture quality.

Therefore, the single integrated PCB 260 generates the Voff signal considering maximum resistance among the resistances applied to the gate driving signal line groups 281, 282, and 283.

However, although the Voff signal is input into respective gate driver ICs through the respective corresponding gate driving signal line groups 281, 282, and 283 considering the maximum resistance, the final Voff signal still has a deviation due to the resistance. Accordingly, in order to eliminate the deviation, a turning resistor is provided.

The turning resistor is respectively formed in each of the gate driving signal line groups 281, 282, and 283 and enables to output a Voff signal with a minimum deviation, thereby eliminating the flicker and the picture division appearance problems.

Next, a method for operating the LCD panel according to the above preferred embodiments is described.

First, the single integrated PCB 260 generates a gate driving signal and a data driving signal. The data driving signal is transformed into a source signal including a gray scale voltage through the dual functioning data tape carrier package 226 and the single functioning data tape carrier package 229. The source signal is then applied to the data line group 246.

The gate driving signals from the single integrated PCB 260 are concurrently input to all the gate driver ICs 212 of the gate tape carrier packages 210 through the first gate driving signal line group 281 to the third gate driving signal line group 283.

Figure 5:
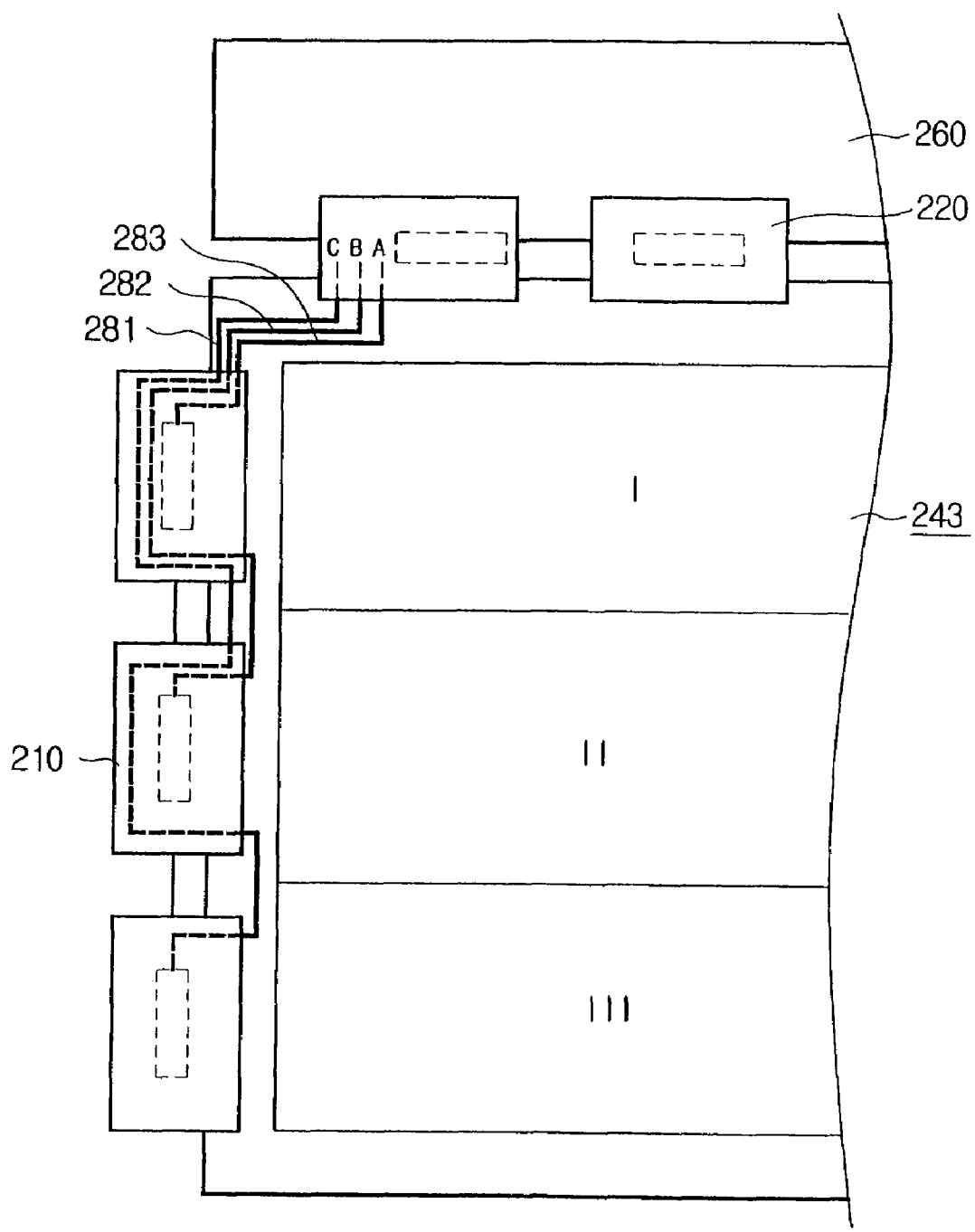
FIG. 5 is a schematic view for describing an operation of the liquid crystal display panel according to a preferred embodiment of the present invention.

The first corresponding gate driving IC receives a first gate driving signal from the single integrated PCB 260 through the third gate driving signal lines group 283 and then applies Von signals to gate lines in portion of "I" of the effective display region in FIG. 5 using OE signal. The image of the portion "I" is maintained for one frame.

The second corresponding gate driving IC receives a second gate driving signal from the single integrated PCB 260 through the second gate driving signal line group 282 and then applies Von signals to gate lines in portion "II" of the effective display region in FIG. 5. The picture of the portion "II" is also maintained for one frame together with the picture of the portion "I".

The third corresponding gate driving IC receives a third gate driving signal transmitted from the single integrated PCB 260 through the first gate driving signal line group 281 and then applies Von signals into gate lines in portion "III" of the effective 21. display region in FIG. 5. The picture of the portion "III" is also maintained for one frame together with the picture of the portion "I" and portion "II".

Because these steps are performed very quickly, it may display a moving picture or a clean still picture on the panel.

The liquid crystal display panel according to the present invention does not need a gate PCB and only the gate tape carrier packages 210 are coupled to the ends of the gate lines 241 formed on the TFT substrate 240.

Figure 7:
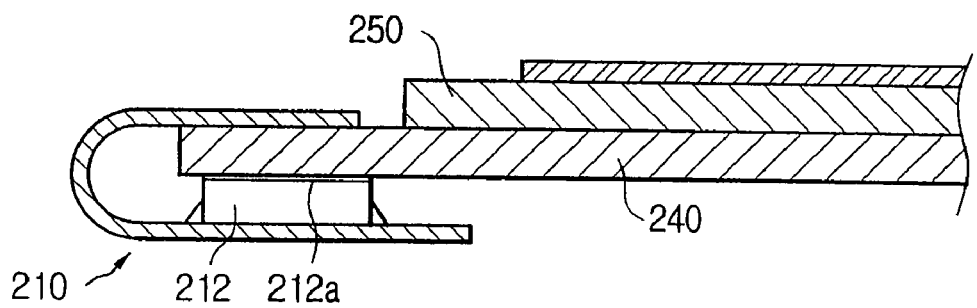
FIG. 7 is a sectional view taken along the line 7-7' of FIG. 6.

Thus, these gate tape carrier packages 210 are bent and then attached to the rear surface of the TFT substrate 240 as shown in FIGS. 6 and 7. This would produce a compact liquid crystal display panel.

Figure 8:
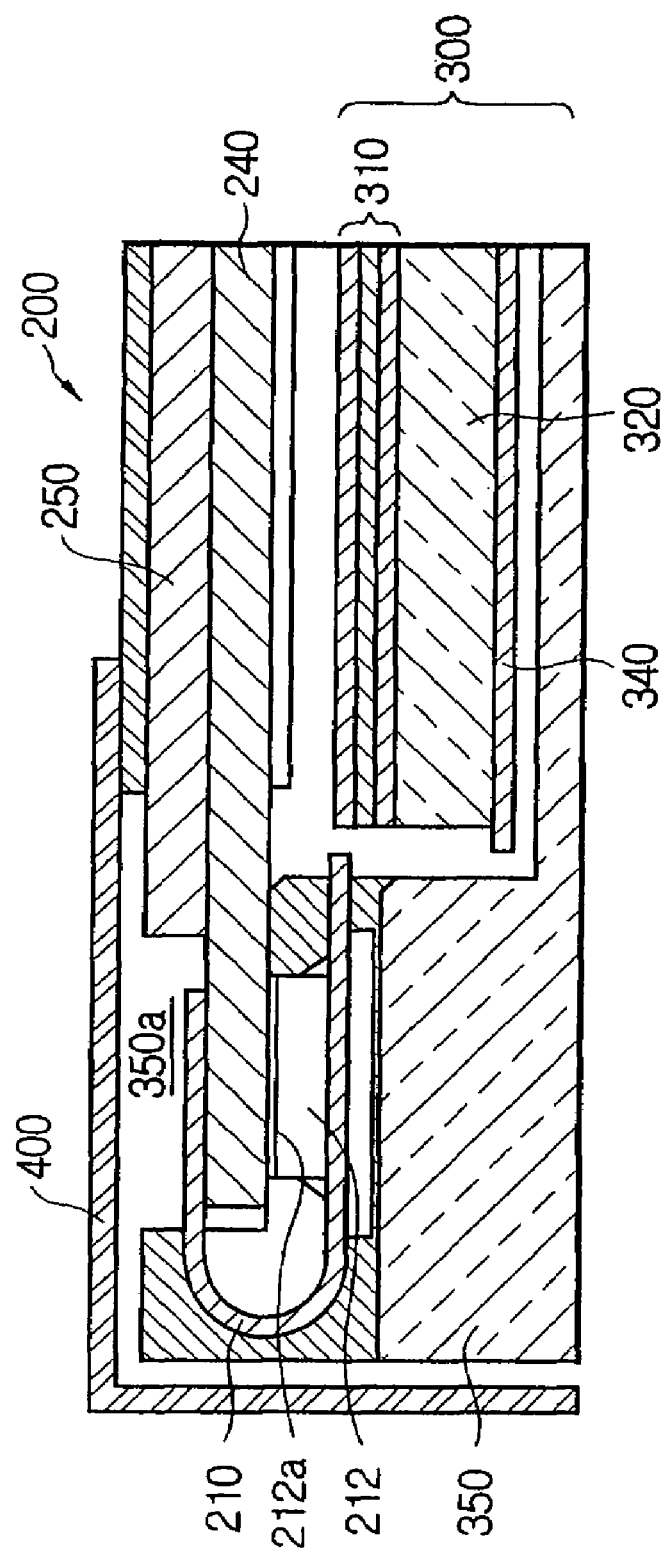
FIG. 8 is a partial sectional view of the liquid crystal display according to a preferred embodiment of the present invention.

FIG. 8 is a partial sectional view that can be handled easily showing a part of a liquid crystal display according to the present invention.

Referring to FIG. 8, a backlight assembly 300 includes a mold frame 350. The mold frame 350 receives a light reflecting plate 340, a light guiding plate 320, and optical sheets 310 in the named order. The liquid crystal panel of the present invention is mounted on the optical sheets 310 and the perimeter region of the liquid crystal panel 200 is fixed by a chassis 400.

Here, a tape carrier package 210 one end of which is connected to the TFT substrate 240 is bent and a gate driver IC 212 of the tape carrier package 210 is attached to the rear surface of the TFT substrate 240 by a fixing means such as a double sided adhesive tape, an adhesive, or a clip.

The mold frame 350 has a receiving groove 350a that can accommodate the tape carrier package 210.

Meanwhile, although the above described embodiments show and describe the tape carrier packages of the above-described configurations, a chip on flexible (COF) having more flexible base film than the base film of the flexible printed circuit may be also used.

Also, although FIG. 4 shows and describes that the gate driving signal transmission pattern 223 is integrated together with both of the data driving signal input pattern 224 and the data driving signal output pattern 225 on the data tape carrier package 226 of FIG. 4, only the gate driving signal transmission pattern 223 may be formed on an independent flexible base no having a driving chip.

As described above, the present invention can provide a compact size liquid crystal display by integrally processing gate and data driving signals using a single integrated PCB.

Moreover, using the single integrated PCB may eliminate the connector and a flexible printed circuit that is used for connecting two PCBs. As a result, spaces for the connector and the flexible printed circuit can be saved. Also, the whole assembly process is simplified.

While the present invention has been described in detail, it should be understood that various changes, substitutions and alterations can be made hereto without departing from the spirit and scope of the invention as defined by the appended claims.

What is claimed is:

1. A liquid crystal display (LCD) panel, comprising:
a substrate;
a gate line and a data line formed on the substrate;
a gate driving signal transmission pattern formed on the substrate and connected to the gate line for transmitting a gate driving signal thereto;
a data driving signal transmission pattern formed on the substrate and connected to the data line for transmitting a data driving signal thereto; and,
a gate signal transmission pattern formed on the substrate adjacent to the data driving signal transmission pattern for transmitting a gate signal from a first external device to the gate driving signal transmission pattern.

2. The LCD of claim 1, wherein:
the substrate comprises a display region in which the data line and the gate line intersect each other, and a peripheral region formed around the display region, and,
the gate driving signal transmission pattern, the data driving signal transmission pattern and the gate signal transmission pattern are formed in the peripheral region.

3. The LCD panel of claim 2, wherein the peripheral region comprises a first edge portion formed along a first side of the substrate and a second edge portion formed along a second side of the substrate adjacent to the first side, and,
the data driving signal transmission pattern is formed on the first edge portion, the gate driving signal transmission pattern is formed on the second edge portion, and, the gate signal transmission pattern is formed extending from the first edge portion to the second edge portion.

4. The LCD panel of claim 3, wherein the gate signal transmission pattern comprises:
an input terminal formed on the first edge portion;
an output terminal formed on the second edge potion; and,
a main signal pattern coupled between the input terminal and the output terminal.

5. The LCD panel of claim 4, wherein the input terminal of the gate signal transmission pattern and the data driving signal transmission pattern are formed adjacent to each other.

6. The LCD panel of claim 4, wherein the input terminal of the gate signal transmission pattern and the data driving signal transmission pattern are connected to the first external device.

7. The LCD panel of claim 6, wherein the first external device transmits the gate signal and the data driving signal to the gate signal transmission pattern and the data driving signal transmission pattern, respectively.

8. The LCD panel of claim 7, wherein the first external device receives a data signal and generates the data driving signal.

9. The LCD panel of claim 8, wherein the first external device comprises a driving circuit for generating the data driving signal.

10. The LCD panel of claim 7, wherein the first external device is a tape carrier package.

11. The LCD panel of claim 4, wherein the output pattern of the gate signal transmission pattern and the gate driving signal transmission pattern are formed adjacent to each other.

12. The LCD panel of claim 4, wherein the output pattern of the gate signal transmission pattern and the gate driving signal transmission pattern are connected to a second external device.

13. The LCD panel of claim 12, wherein the second external device receives the gate signal from the gate signal transmission pattern and generates the gate driving signal.

14. The LCD panel of claim 13, wherein the second external device comprises a driver circuit for generating the gate driving signal.

15. The LCD panel of claim 14, wherein the second external device is a tape carrier package.

16. The LCD panel of claim 4, wherein the main signal pattern of the gate signal transmission pattern is formed along the first side and the second side of the substrate.

17. A liquid crystal display (LCD) panel, comprising:
a substrate comprising:
a display region; and,
a peripheral region formed around the display region;
a first line formed in the display region for transmitting a first driving signal;
a second line formed in the display region and intersecting the first line for transmitting a second driving signal;
a first driving signal transmission pattern formed in the peripheral region and connected to the first line for transmitting the first driving signal thereto;
a second driving signal transmission pattern formed in the peripheral region and connected to the second line for transmitting the second driving signal thereto; and,
a first signal transmission pattern formed in the peripheral region adjacent to the first driving signal transmission pattern for transmitting a first signal to the second driving signal transmission pattern.

18. The LCD panel of claim 17, wherein the peripheral region comprises a first edge portion formed along a first side of the substrate and a second edge portion formed along a second side of the substrate adjacent to the first side, the first driving signal transmission pattern is formed on the first edge portion and the second driving signal transmission pattern is formed on the second edge portion, and, the first signal transmission pattern is formed extending from the first edge portion to the second edge portion.

19. The LCD panel of claim 18, wherein the first signal transmission pattern comprising:

an input terminal formed on the second edge portion;

an output terminal formed on the first edge portion; and, a main pattern formed along the first side and the second side of the substrate.

* * * * *